US007793251B2

(12) United States Patent
Goodnow et al.

(10) Patent No.: US 7,793,251 B2
(45) Date of Patent: Sep. 7, 2010

(54) METHOD FOR INCREASING THE MANUFACTURING YIELD OF PROGRAMMABLE LOGIC DEVICES

(75) Inventors: Kenneth J. Goodnow, Essex, VT (US); Clarence R. Ogilvie, Huntington, VT (US); Christopher B. Reynolds, Underhill, VT (US); Sebastian T. Ventrone, South Burlington, VT (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 818 days.

(21) Appl. No.: 11/275,536

(22) Filed: Jan. 12, 2006

(65) Prior Publication Data

US 2006/0112319 A1    May 25, 2006
US 2007/0162792 A1    Jul. 12, 2007

(51) Int. Cl.
*G06F 17/50* (2006.01)
(52) U.S. Cl. .......................................... 716/16; 716/17
(58) Field of Classification Search ............. 716/16–17; 714/711, 724, 733
See application file for complete search history.

(56) References Cited

U.S. PATENT DOCUMENTS 6,530,071 B1    3/2003   Guccione et al.
6,817,005 B2 *  11/2004  Mason et al. ................... 716/16
7,111,213 B1 *  9/2006   Dastidar et al. ............. 714/724
7,216,277 B1 *  5/2007   Ngai et al. .................... 714/733
7,228,521 B1 *  6/2007   Ma et al. ......................... 716/17

OTHER PUBLICATIONS

XILINX®, XAPP290 (v1.1), "Two Flows for Partial Reconfiguration: Module Based or Difference Based", Nov. 25, 2003, pp. 1-4.

* cited by examiner

*Primary Examiner*—Vuthe Siek
(74) *Attorney, Agent, or Firm*—Connolly Bove Lodge & Hutz LLP; Michael J. LeStrange

(57) ABSTRACT

A method for increasing the manufacturing yield of field programmable gate arrays (FPGAS) or other programmable logic devices (PLDs). An FPGA or other PLD is formed in several sections, each of the sections having its own power bus and input/output connections. Each section of the FPGA or other PLD is tested to identify defects in the FPGA or other PLD. The FPGA or other PLD is sorted according to whether the section has an acceptable number of defects. An assigned unique number for the FPGA or other PLD chip or part identifies it as partially good. Software for execution and configuring the FPGA or other PLD may use the unique number for programming only the identified functional sections of the FPGA or other PLD. The result is an increase in yield as partially good FPGAs or other PLDs may still be utilized.

10 Claims, 12 Drawing Sheets

METHOD FOR INCREASING THE MANUFACTURING YIELD OF PROGRAMMABLE LOGIC DEVICES

BACKGROUND OF THE INVENTION

The present invention relates to the manufacture of field programmable gate arrays, and other programmable logic devices. Specifically, a process is described which increases the manufacturing yield of semiconductor field programmable gate arrays.

The design of large-scale electronic systems has been facilitated through the use of field programmable gate arrays (FPGAs) and other programmable logic devices (PLDs). These arrays comprise generic logic devices that are configurable under control of configuration software to generate virtually any circuit design. FPGAs and PLDs offer a number of benefits, including relatively short design cycles, reduced costs as well as flexible reprogrammability.

As is the case with most semiconductor devices, the size of an FPGA or other PLD is determined by the manufacturing process. Manufacturing processes often have a very low yield, wherein only a small percentage of the manufactured FPGAs are good. The low yield increases the manufactured price for the FPGAs or other PLDs. The reason for such low yields is that devices must be defect-free to be fully functional. That is, if a single defect in one of the devices of the array occurs, the array itself is considered to be defective.

Various techniques have been developed to deal with isolated defects of an FPGA or other PLD. In one example, spare components are made available on the device which can be substituted for failed components. However, there is a penalty in that the device size must increase to accommodate the space required for spare components. This adversely affects yield.

Software techniques have been developed to design around individual components that have failed. When a failed component is discovered in the FPGA or other PLD during testing, the device may be marked as "in use" to make sure, when programming the FPGA or other PLD, the device is not programmed. Such a technique is shown in U.S. Pat. No. 6,530,071. In accordance with the subject matter of this reference, defect tolerance is addressed at the logic core/application level. In programming FPGAs or other PLDs, a design program is executed which includes executable code that both specifies a circuit design and generates a configuration bit file to implement the circuit design. The design program includes codes that selectively skip the configurable logic elements and resources that contain defects. However, as the number of defects increase, the ability to program the device decreases since more consideration must be given to avoid particular circuit elements that contain defects.

BRIEF SUMMARY OF THE INVENTION

In accordance with the invention, a method and field programmable gate array (FPGA) or other programmable logic device (PLD) are disclosed which will increase manufacturing yield for FPGAs or other PLDs. The invention relies upon a strategy for manufacturing FPGAs or other PLDs in sections, where each section may have its own power bus, input/output (I/O) bus and configuration bus. If defects can be isolated to a particular section of the FPGAs or other PLDs, the remaining sections can be used standalone, or otherwise configured to be a usable circuit. Partially good FPGAs or other PLDs can be sorted and assigned a unique FPGA product identification number. Partially good FPGAs or other PLDs may then be sold with software which only configures the section of the FPGA or other PLD which does not contain defects or has an acceptable number of defects.

One embodiment of the invention is a method for increasing the manufacturing yield of a programmable logic device (PLD) integrated circuit comprising: configuring the FPGA or other PLD in a first section and a second section, each section having independent power and input/output (I/O) connections; testing the FPGA or other PLD in the first section and the second section to identify defects and characterize each section as at least one of a functional section and a non-functional section; sorting the FPGA or other PLD in accordance with the functional and non-functional test results; and assigning a code to the FPGA or other PLD corresponding to the functional and non-functional test results.

Another embodiment of the invention is a method for increasing the manufacturing yield of a field programmable logic array (FPGA) or other programmable logic device (PLD) comprising: dividing said FPGA into sections, each section having separate power busses and I/O busses; testing each section of the FPGA to determine if one or more sections have an unacceptable level of defects; and when one of the sections has an unacceptable level of defects, bonding external connections to said power bus and I/O bus of only the one or more sections that have an acceptable level of defects.

Yet another embodiment of the invention is a method for increasing the manufacturing yield of a field programmable gate arrays (FPGA) or other programmable logic device (PLD) with a configuration port when the second section is defective; and configuring the second section with a configuration port when the first section is defective.

Yet another embodiment of the invention is a method for improving the usability of a field programmable logic array (FPGA) or other programmable logic device (PLD) by constructing the FPGA or other PLD in such a manner that connections to external circuitry for a given orientation are the same as when the FPGA or other PLD is rotated 180° or smaller increments, wherein the increments are dependent on hardware implementation requirements.

Both a software technique as well as a hardware technique can be provided to sort the tested FPGAs or other PLDs. In accordance with the software method for sorting partially defective FPGAs or other PLDs, a partial reconfiguration software package is provided so that only the region of the FPGA or other PLD that have no defects or that have an acceptable number of defects is programmed.

In accordance with a hardware method, power and I/O connections can be changed so that the configuration bit stream, power, and I/O connections are confined to the region containing no defects. Fuses may be used to route the bit stream and I/O connections so that only the partially good region is available for use.

DETAILED DESCRIPTION OF THE PREFERRED EMBODIMENT

Figure 1:
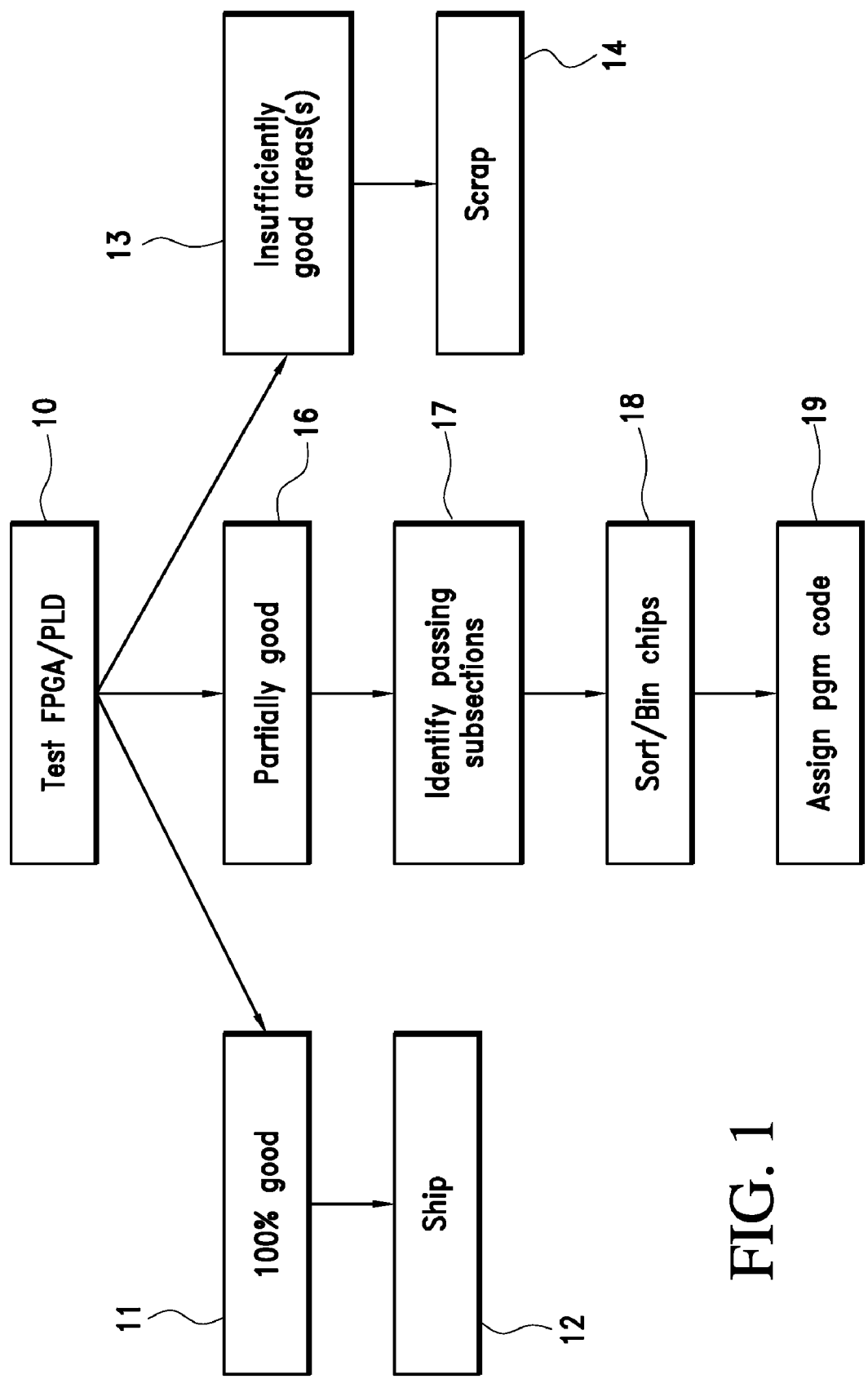
FIG. 1 illustrates the decision flow for testing and binning or sorting partially good FPGAs or PLDs.

FIG. 1 illustrates an exemplary test decision flow diagram for implementing a partially good FPGA or PLD system of production. The FPGA or PLD is placed in a test fixture in step 10 where each of the circuit elements comprising the FPGAs or PLDs is tested. In accordance with one exemplary arrangement of an FPGA or PLD, the FPGA or PLD rows of logic elements are arranged in columns and rows. A configured logic element may comprise a flip-flop, multiplexer, etc. that is configured from a data file created by circuit designers.

In accordance with known testing techniques for FPGAs or PLDs, the FPGA or PLD is tested and it is determined whether it is 100% good in step 11, partially good in step 16 or insufficiently good in step 13. This constitutes a binning or sorting of the manufactured product into the three different bins. The number of bins is scalable, depending on the desired number of subsection or regions of the FPGA or PLD that are available for use in a partially good strategy, potentially including unique software versions which would accompany each binned FPGA or PLD so that it could be programmed to operate only in regions containing circuit element which are all functional. When the FPGA or PLD tests in step 11 are 100% good, meaning that all logic elements are functional, they are shipped in step 12 with appropriate configuration software for configuring the entire FPGA or PLD in accordance with a desired circuit design. In the event that the FPGA or PLD does not contain any one region that has passed the test, as determined in step 13, these devices are identified as defective and scrapped as unusable in step 14.

Step 16 illustrates a partially good strategy wherein one or more regions of an FPGA or PLD have tested well with all its respective components operable. The test verifies access to all the components by the configuration bus, the integrity of the power supply bus and input/output (I/O) connections for the tested region of the FPGA or PLD. Those sections of the partially good FPGA or PLD that pass the required tests are identified in step 17. These partially good FPGAs or PLDs are then assigned to bins, based on their test data. A program code is assigned in step 19 to the partially good FPGA or PLD in accordance with their assigned bin(s). The assigned unique bin codes are used by the configuration software to identify and configure the partially good sections of the FPGA or PLD.

Figure 2:
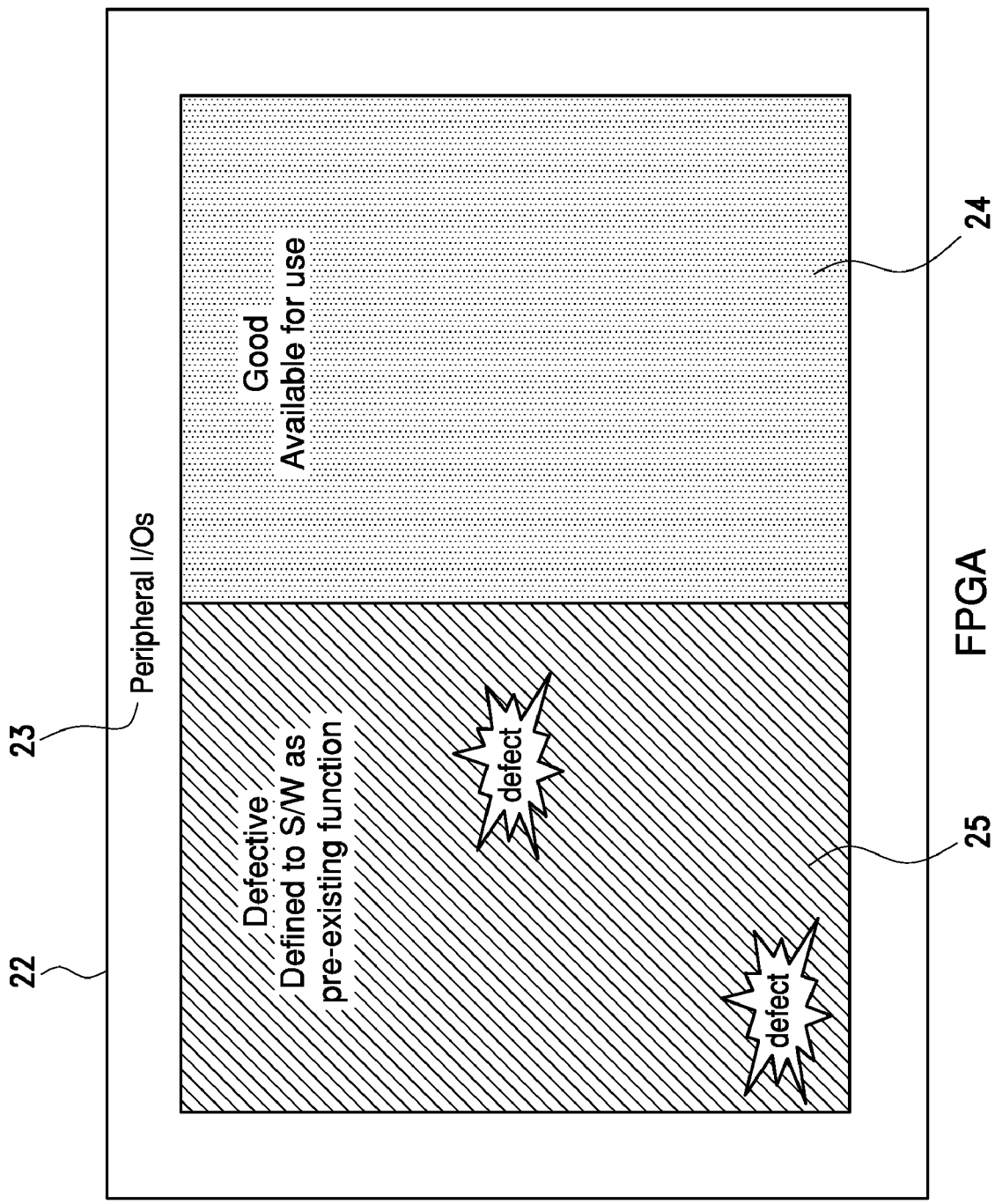
FIG. 2 illustrates the partitioning of an FPGA or PLD into regions, so that defective regions may be identified and sections that are available for use may be implemented.

The concept of defining regions of a FPGA or PLD for partially good implementation is illustrated in FIG. 2. In FIG. 2, the array is divided into an east 24 and west 25 half of the FPGA 22 array. While the tests of the entire array may illustrate one or more defects in the west array 25, the east array 24 may pass the test. In accordance with the invention, the FPGA or PLD is assigned a bin number which is used by the supplied configuration software to program the east half 24 of the FPGA 22. Shown generally are the peripheral input/output connections 23 and power bus connections which are used to configure one or the other or both halves of a FPGA 22. While the foregoing illustrates a vertical sectioning of the FPGA or PLD, it is clear that the FPGA or PLD can be sectioned along other dimensions as long as input/output, and power bus connections can be maintained to the individual sections, or alternate connections can be defined using steering logic, fuses, or other means. Test strategies may be developed for parallel testing of a different section of the FPGA or PLD to facilitate their implementation.

The advantage of the foregoing software method of configuring partially good FPGAs or PLDs is the avoidance of any hardware modification by the FPGA or PLD developer (and in certain cases, the customer as well). Non-functional areas are identified and in the simplest partially good implementation, can be treated as though they are a pre-existing configuration by the FPGA or PLD configuration software based on the assigned bin programming code. Localized circuitry or routing defects, specific input/output or long route defects may be tolerable in this process since they are confined to a specific region.

Figure 3:
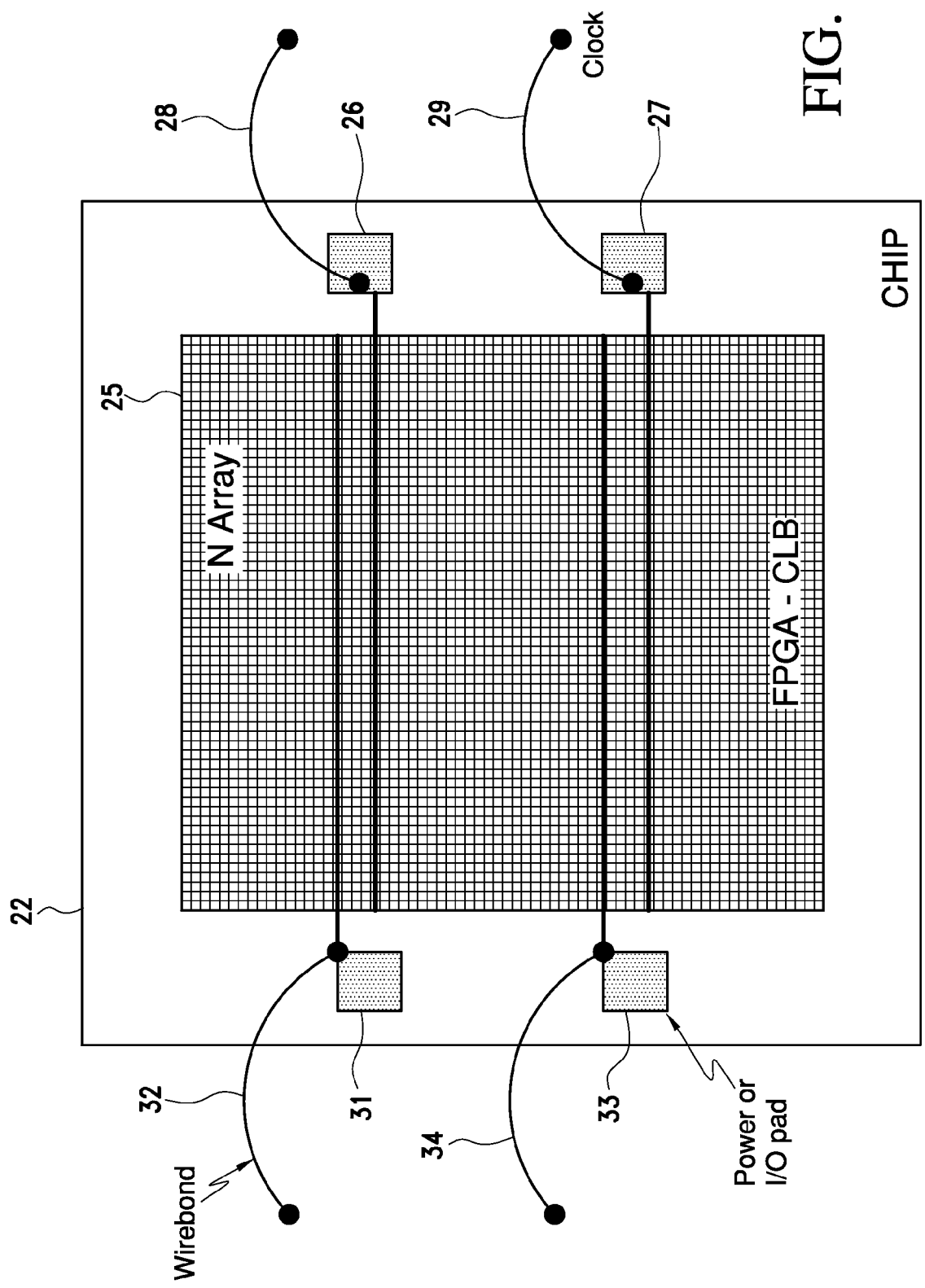
FIG. 3 shows an example where the FPGA or PLD array is not divided into regions.

The foregoing methodology may also be used in a hardware-oriented design. Referring now to FIG. 3, the conceptual FPGA 22 layout is shown wherein an array of circuit components is accessed by a clock or signal pads 26, 27 and power or input/output pads 31, 33. During fabrication, the clock pad 27, power or I/O pad 33 and I/O pads 26, 31 are connected to out board connections of the PLD or FPGA 22. Wire bonds 28, 29, 32 and 34 connect respective pads of the FPGA array 25 to the external terminals of the component. Wirebonds are shown here as a representative example. However, other connection methods can also be employed. If there is a failure in one or more components of the FPGA array 25, the entire chip may be scrapped depending on whether or not it is possible to design around the specific defects.

Figure 4:
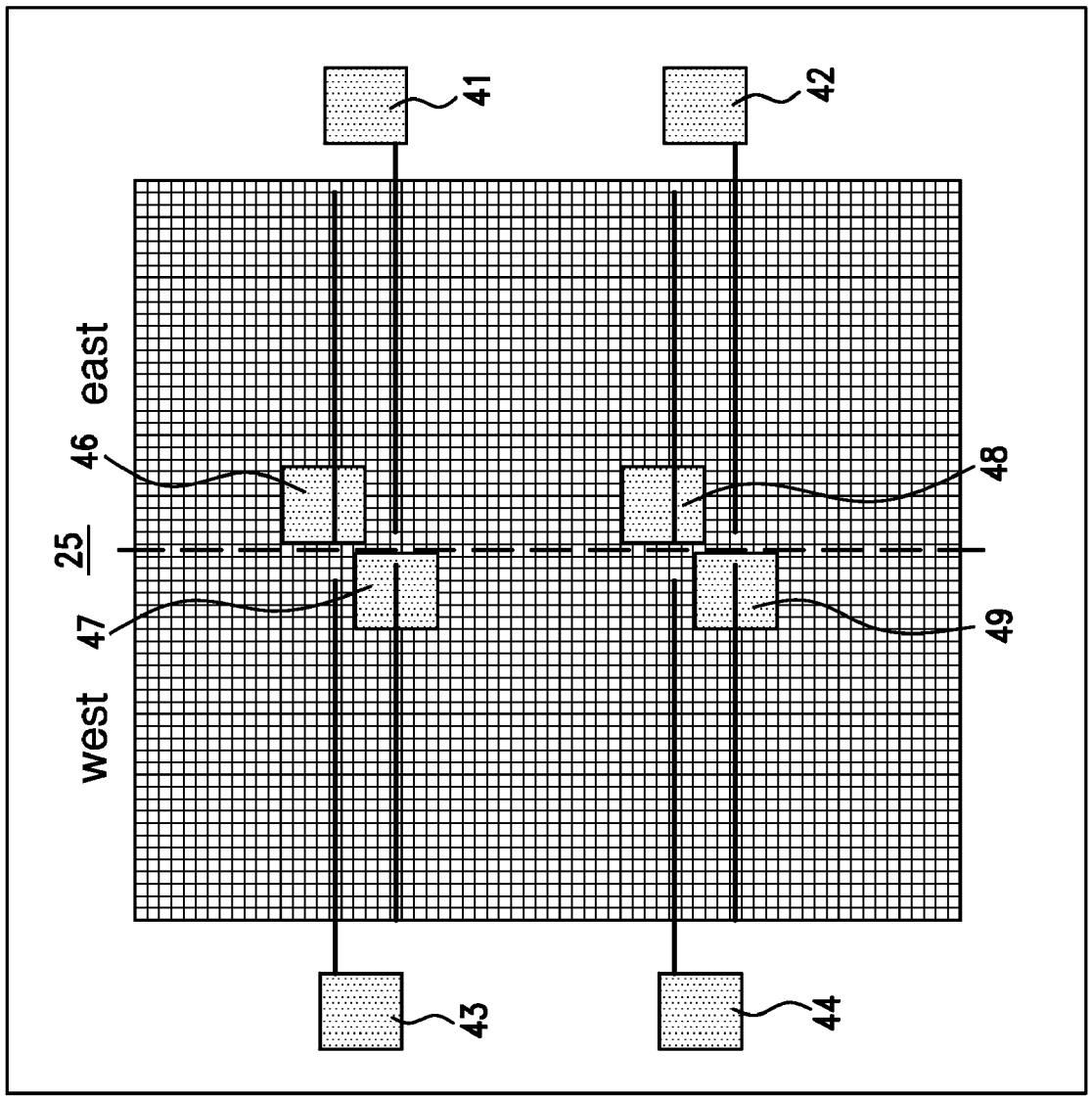
FIG. 4 shows how power and I/O connections are modified in a hardware solution for using partially good FPGAs or PLDs.

FIG. 4 shows how the array can be arranged in east and west halves. The FPGA 25 includes an array of components 40 connected to pads 41-44 and 46-49. By arranging a symmetric design of internal connections, wherein power, clock and other signal routes are split into separate sections, with discrete sections in each region of the PLD or FPGA that is to be considered for partial good binning or sorting. FIG. 4 shows simple examples of this concept, where connection 27 in FIG. 3 is split into 42 and 49 in FIG. 4. Other connections in FIG. 3 are similarly split in FIG. 4. This concept can be extended to more complex bus structures. It can also be extended to more complex means/mechanisms for splitting or joining connections using, for example, fuses, programmable steering logic or other well known connecting means. Further, even more complex connecting means can include, but are not limited to, multi-dimensional splitting, division of signals into rotational quadrants or other physical divisions.

Figure 5:
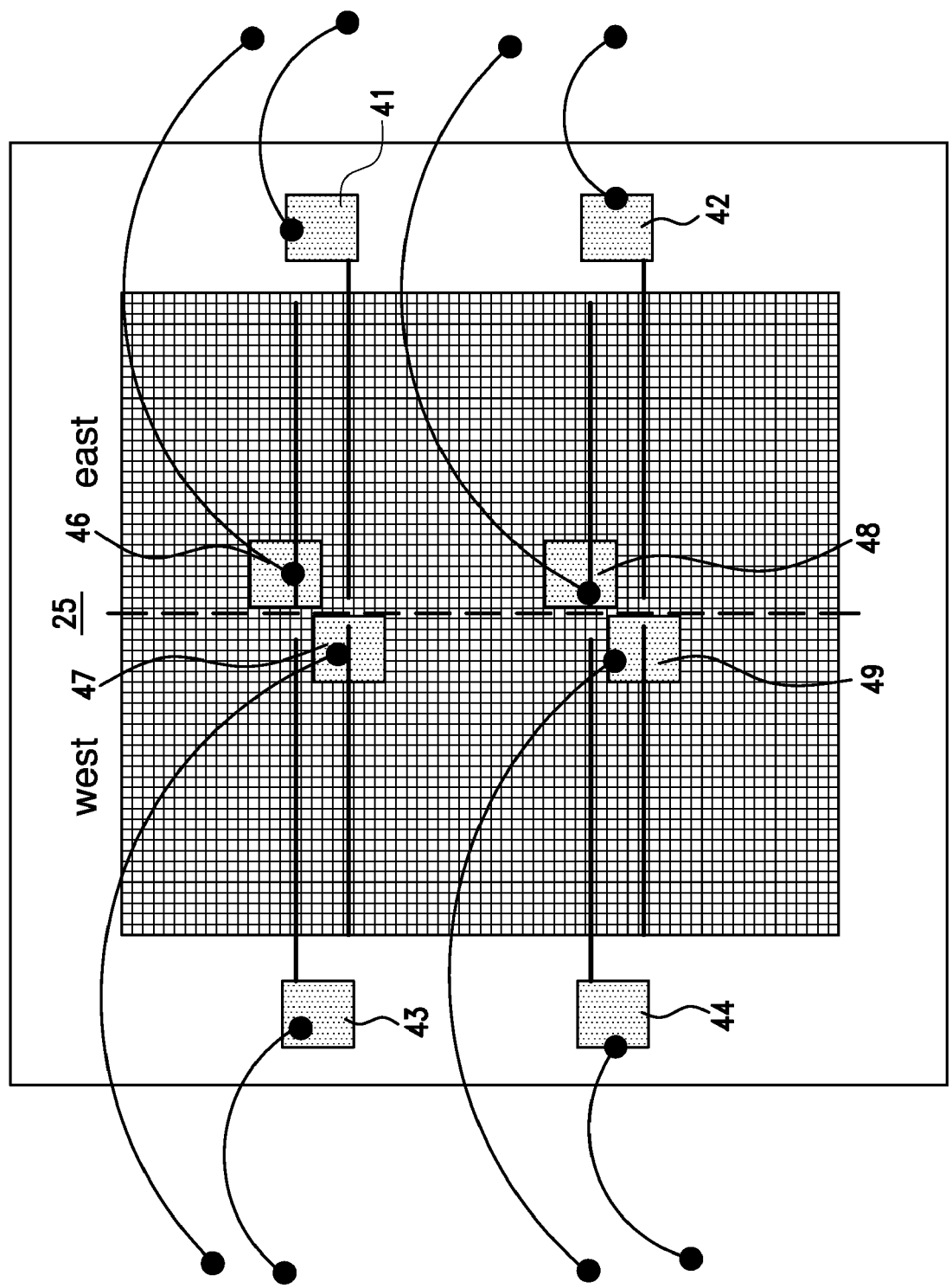
FIG. 5 shows the hardware connections when the full chip is found to be usable.

Referring to FIG. 5, when the entire chip tests good, the bonding to the chip may be completed by duplicate bonds. Each of the pads 41-44 and 46-49 has wire bonds. These bonds go to external connections of the FPGA or PLD, or can serve as jumpers between each of the east and west sides of the FPGA 25 which has tested 100% good. Additional connecting means besides wirebonds (e.g., fuses, programmable connections, solder bumps, etc.) can also be employed as mentioned previously.

Figure 6:
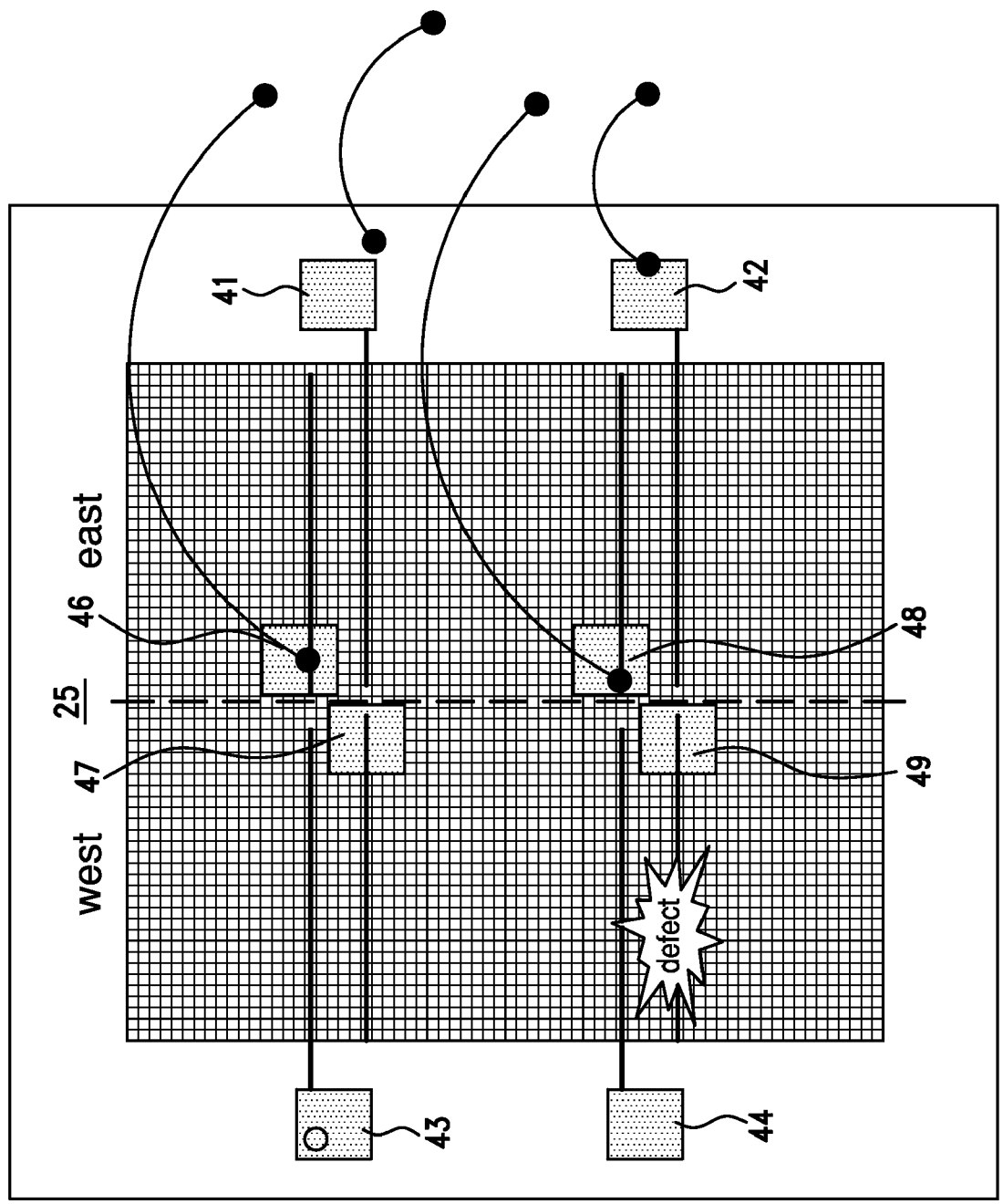
FIG. 6 shows how a partially good FPGA or PLD can be implemented with appropriate hardware connections.

FIG. 6 illustrates the circumstance where the west half of the FPGA 25 has been determined to contain a defect. In this scenario, only the pads of the east side of FPGA 25 are connected to the external connections. Accordingly, the east half is functional and can be programmed to operate in accordance with a specific configuration code without the remaining west half that contains the defect. A similar process can be used for cases where the west half of the array is defect-free. This concept can be applied to other more complex partially good subsections as well.

Figure 7:
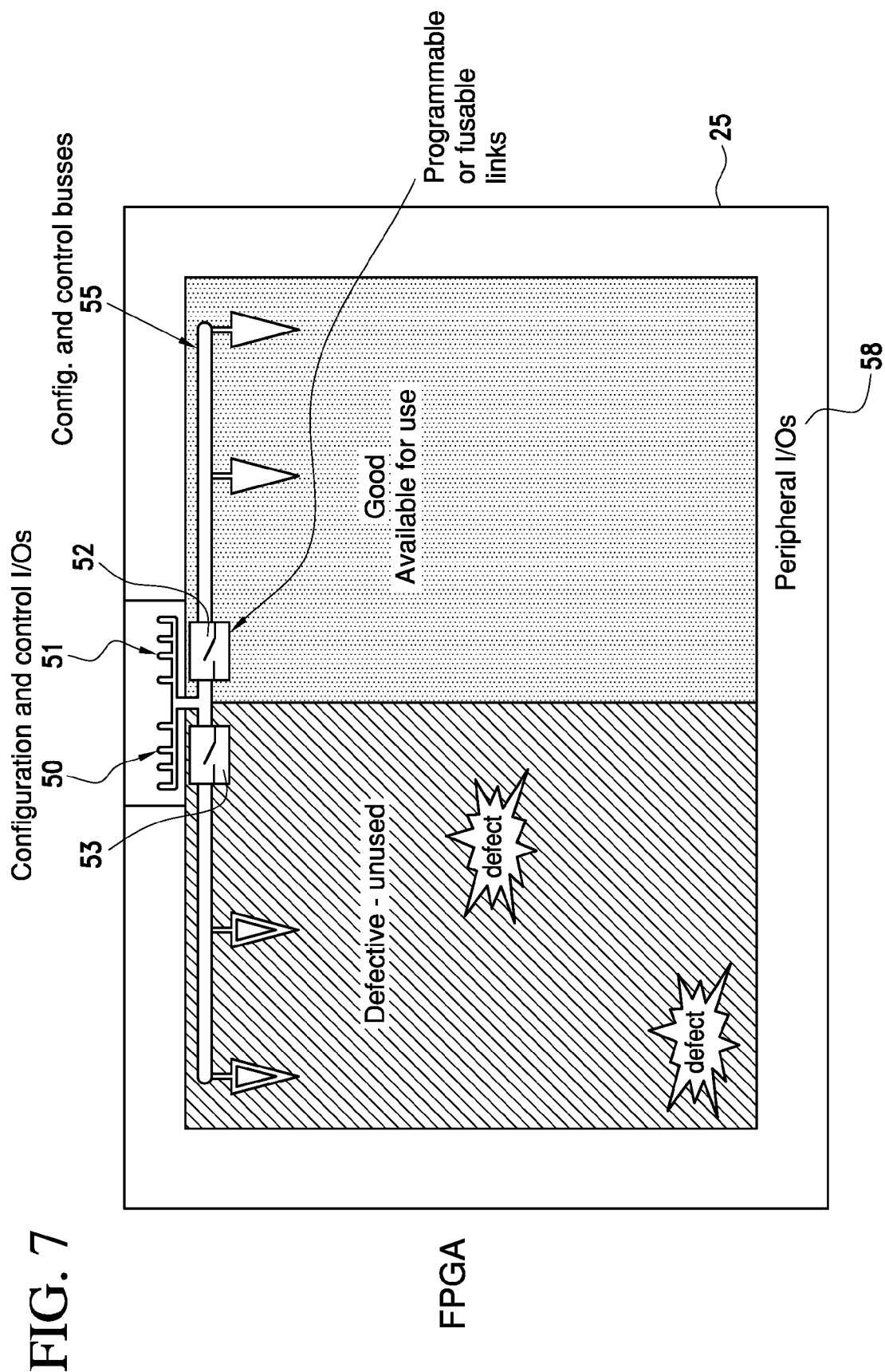
FIG. 7 shows an approach for isolating regions which are functional from regions that are defective in an FPGA or PLD, using programmable or fusable links to direct signals to the functional region of the circuitry.

FIG. 7 illustrates the use of steering logic to control configuration of one or the other halves of a tested FPGA 25. In this scenario, programmable or fusible links 52 or 53 can isolate the configuration and control signals 55 to each of the halves of the FPGA 25. In this scenario, a single configuration bit stream may be generated for either partially good FPGA or PLD sections/regions, since the hardware controls will steer those signals to the "good/functional" half, while avoiding the defective half of the FPGA.

Figure 8:
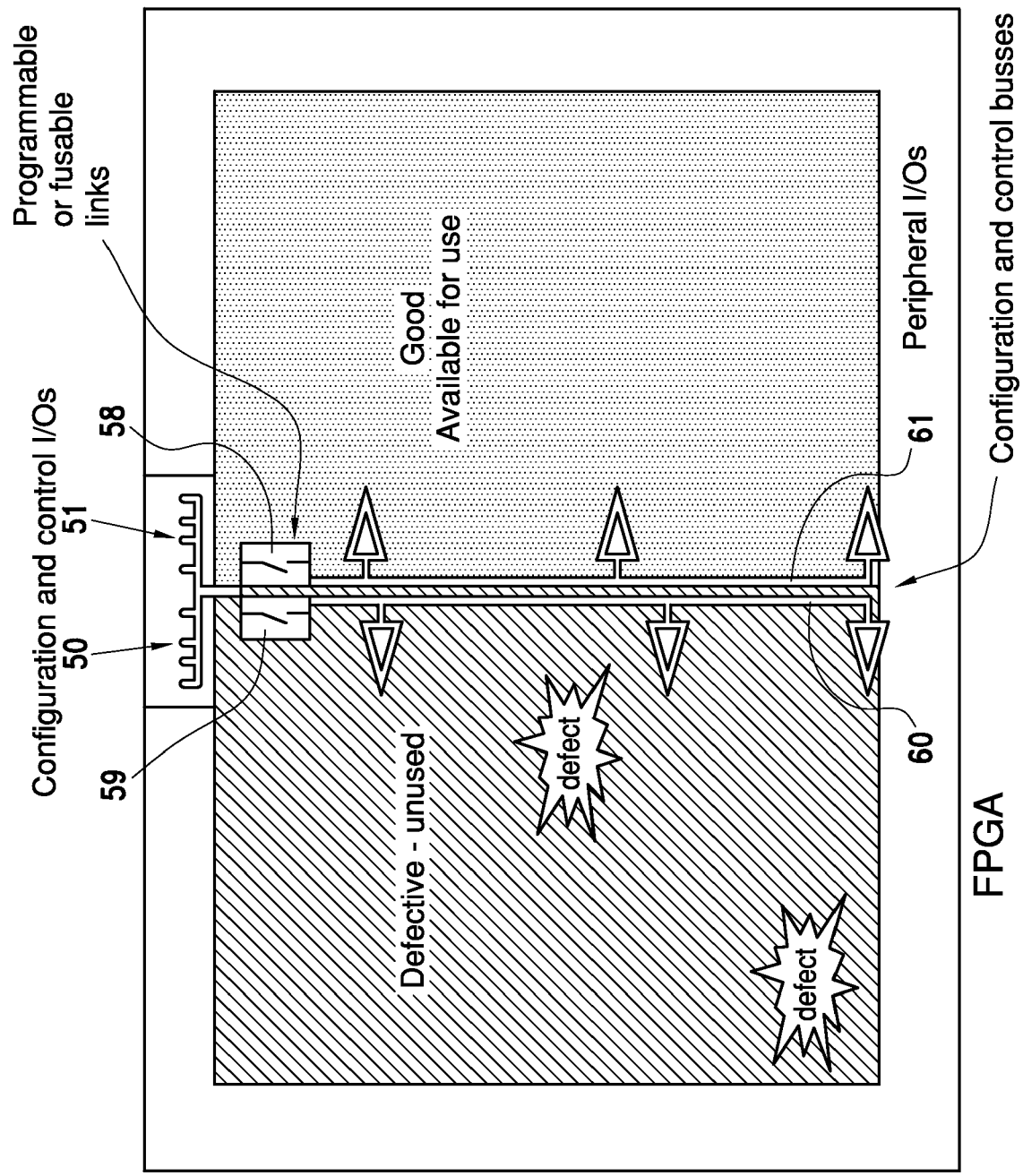
FIG. 8 shows another approach for an implementation of using partially good FPGAs.

FIG. 8 illustrates a similar situation, where the FPGA may be organized along vertical configuration and control busses 61, 60. Programmable fusible links 58 and 59 can be operated when a defect is determined in one-half of the FPGA or PLD to isolate the defective portion from the good/functional portion. Other layouts may be utilized to provide a variety of other orientation of the configuration and control busses, corresponding to other more complex methods of dividing the circuitry into partially good regions.

The foregoing hardware components can be used to steer the bit stream and I/O connections with fusible links. In this way only a good/functional portion of the FPGA or PLD is configured. I/O connections can be formed into subsets, and connected by fuses or bonded out as necessary to only include operable I/O sections.

As a second option, programmable links used with the FPGA or PLD header section of the bit stream may setup internal steering logic. These bit stream control bits will establish routing paths for configuration bits to the good/functional sections, as well as route I/O signals to operable I/O inputs of the device. Separate setup programming bit streams or a variety of other potential implementations are also possible using this concept.

Although this may be useful in certain situations, using partially good FPGAs or PLDs does not require redundant elements. The method is scalable, in that the granularity of bins versus the number of software versions or hardware complexity is also selectable. The partially good FPGAs or PLDs are all identified by a particular assigned program code. The assigned program code will be used by the configuration logic to program those sections which are good/functional. By using a split power and contiguous I/O bus throughout, it is possible to enable independent subsection use. I/O connections and configuration bit stream connections can be controlled with fuses or programmable steering logic minimizing any changes in software or use considerations by the customer.

Figure 10:
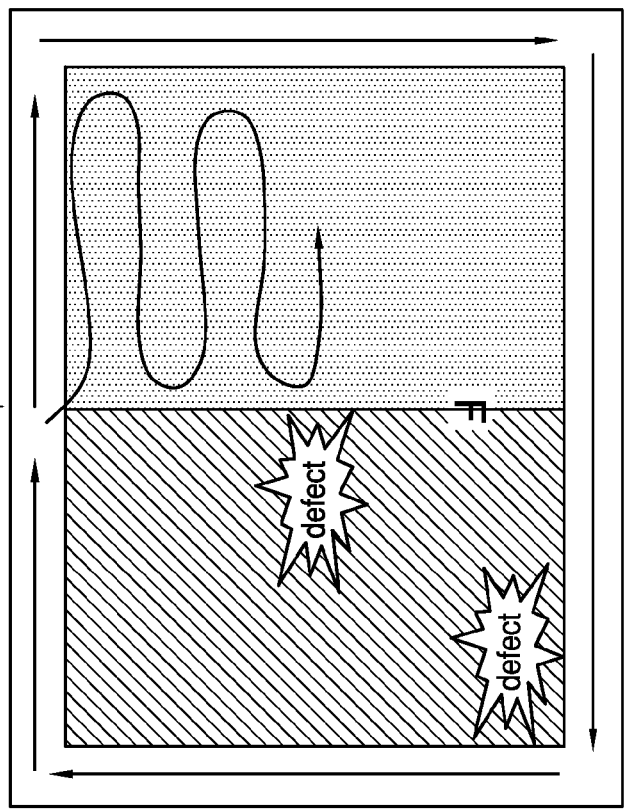
FIG. 10 shows an alternate configuration input that is implemented by rotating the FPGA 180° and/or using fused connections to good/functional sections of the FPGA or PLD.
Figure 9:
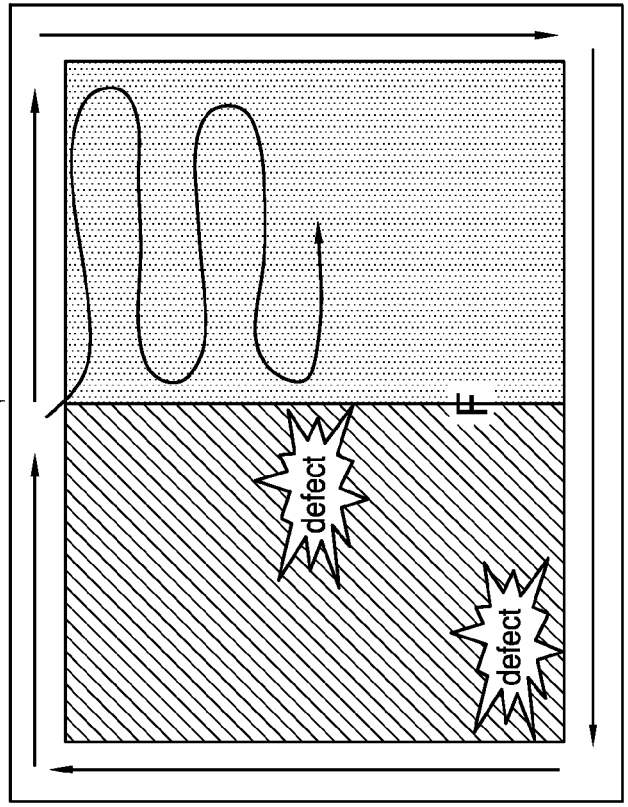
FIG. 9 shows the configuration connections of a device having two configuration inputs for each half of an FPGA or PLD, and the concept of positioning connection points for configuration of other signals appropriately such that these connections point to outside circuitry and remain constant when rotating the FPGA or PLD array 180°.

FIGS. 9 and 10 illustrate still another scenario for using a portion of a FPGA or PLD that has tested good. Two configuration inputs 63 and 64 are provided so that the alternative configuration port 64 is only used when a defect is found in one-half of the FPGA or PLD. FIG. 9 illustrates the use of configuration port 63, which enables programming of the east half of the array. In FIG. 10, the array is rotated 180°. The alternate configuration port 64 is used, programming the west side of the array (which now is rotated to the east side). In this way, the two halves of the FPGA or PLD can appear to be identical even though only one is being used. This concept enables the location of connections from the FPGA or PLD array to outside circuitry to remain constant, by rotating the array.

Figure 11:
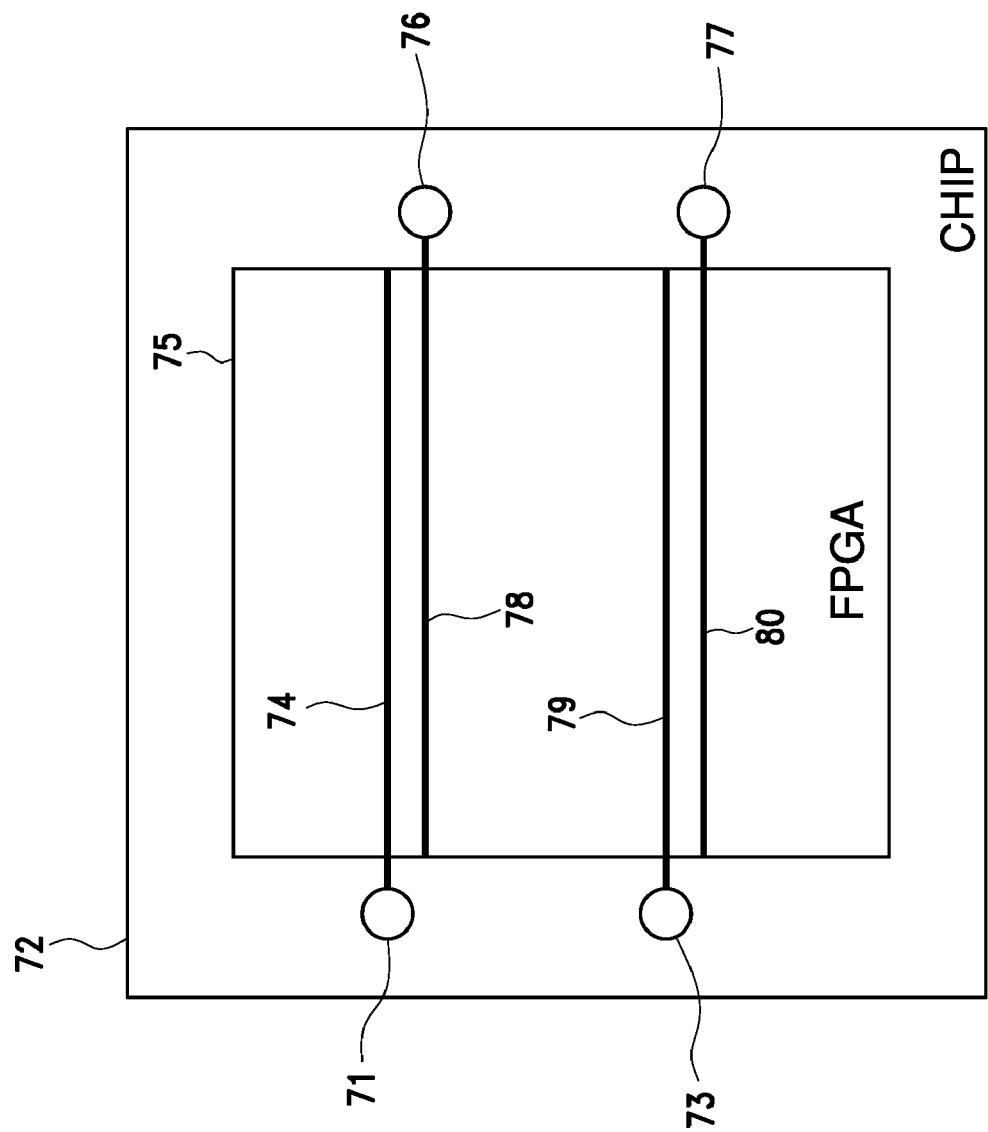
FIG. 11 illustrates an exemplary hardware approach to flip-chip power or I/O connections in FPGAs or PLDs.

FIG. 11 illustrates an exemplary hardware approach to a flip-chip power or I/O connections in FPGAs or PLDs. Flip-chip and other semiconductor packaging implementations can be similarly implemented by selectively adding or deleting solder bumps or other chip-to-package connection methods. In particular, FIG. 11 illustrates an exemplary FPGA 72 layout for an FPGA array 75 wherein an array of circuit components access contiguous power or I/O busses 74, 78, 79, 80. In addition, solder bumps or signal pads 76, 77 and power or input/output solder bumps or pads 71, 73 connect to these contiguous busses. It should be noted, that using the contiguous bussing of FIG. 11 comes the risk of defects in the FPGA due to shorts/opens in the bus. If there is a failure in one or more components of the FPGA array 75, the entire chip may be scrapped depending on whether or not it is possible to design around the specific defects.

Figure 12:
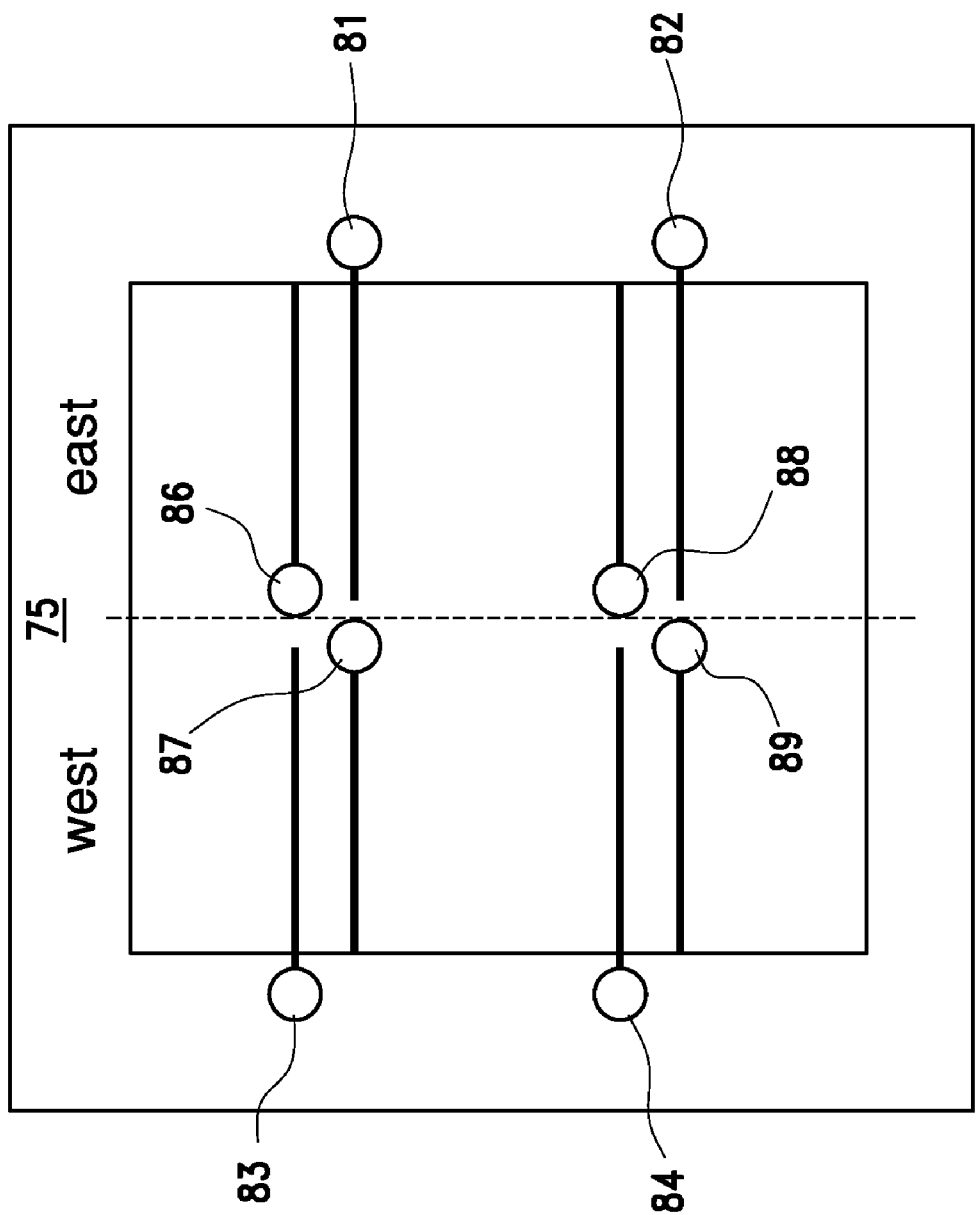
FIG. 12 illustrates an exemplary hardware approach to flip-chip power or I/O connections in FPGAs or PLDs with an east vs. west configuration.

FIG. 12 illustrates an alternative exemplary hardware approach to flip-chip power or I/O connections to that shown in FIG. 11 that instead uses an east vs. west configuration. Each of the solder bumps or pads 81-84 and 86-89 are connected to busses that provide symmetric global wiring (e.g., separate east vs. west power busses). This configuration enables full and/or partial chip implementation and provides additional tolerance for potential shorting defects, as discussed above in connection with FIG. 11.

Figure 13:
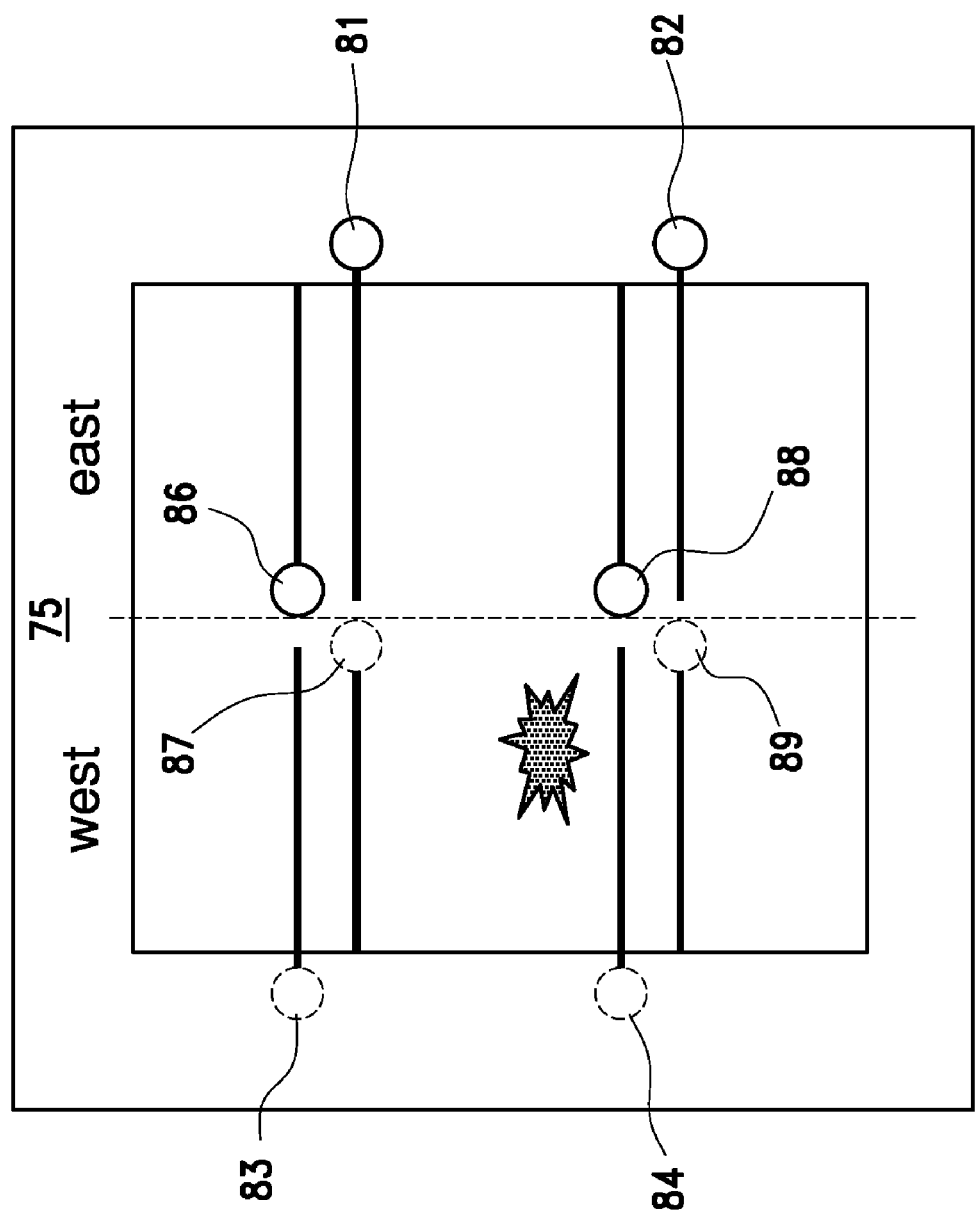
FIG. 13 illustrates an example of an FPGA or PLD configuration where the west half of the FPGA or PLD has been determined to be defective and the east half is functional.

FIG. 13 illustrates an example of a circumstance where the west half of the FPGA 75 has been determined to be defective. In this scenario, only the pads 81, 82, 86, 88 of the east side of FPGA 75 are connected. Accordingly, the east half is functional and can be programmed to operate in accordance with a specific configuration code without the remaining half that contains the defect. A similar process can be used for cases where the west half of the array is defect-free. This concept can be applied to other more complex partial-good subsections as well. Thus, by selectively adding or deleting solder bumps (or other chip-to-package connection methods) to achieve connections to the functional or "good" portions of the circuitry (e.g., the east half) of the FPGA or PLD, one can eliminate connections to defective subsets of circuitry (e.g., the west half). These connections can be achieved by using unique flip-chip carrier bump patterns for each combination of functional and defective areas of the FPGA or PLD. Alternatively, the symmetrical concepts described in this invention can us use to enable a single bump pattern to be used for several functional sections, using symmetrical positions of the chip connections to enable rotating the chip fro connecting to several unique functional sections.

The foregoing description of the invention illustrates and describes the present invention. Additionally, the disclosure shows and describes only the preferred embodiments of the invention in the context of a method for increasing the yield of programmable logic devices, but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described herein above are further intended to explain best modes known of practicing the invention and to enable others skilled in the art to utilize the invention in such, or other, embodiments and with the various modifications required by the particular applications or uses of the invention.

Accordingly, the description is not intended to limit the invention to the form or application disclosed herein. Also, it is intended that the appended claims be construed to include alternative embodiments.

What is claimed as new and desired to be protected by Letters Patent of the United States is:

1. A method for increasing a manufacturing yield of a programmable logic device (PLD) comprising:
    forming a PLD in a first section and a second section;
    forming a first section configuration port and a second section configuration port on the PLD for configuring the first section and second section, respectively;
    testing each of the first section and second section to determine if one of the sections is defective;
    configuring, with a processor, the first section with the first section configuration port when the second section is defective; and
    configuring, with the processor, the second section with the second section configuration port when the first section is defective.

2. The method according to claim 1, further comprising forming a programmable fusible link connecting the first section configuration port and second section configuration port to a first source of configuration data and second source of configuration data, respectively.

3. The method according to claim 2, wherein I/O connections are formed into subsets which are externally connected to only include functional I/O sections.

4. The method according to claim 3, wherein configuration software enables steering logic to establish routing paths to functional sections of the PLD.

5. A method for improving usability of a programmable logic device (PLD) by constructing the PLD with two configuration ports such that connections to external circuitry for a given orientation are the same when the PLD is rotated in 180° or smaller increments, further comprising:
    forming a PLD in a first section and a second section;
    forming the first section configuration port and the second section configuration port on the PLD for configuring the first section and second section, respectively;
    testing each of the first section and second section to determine if one of the sections is defective;
    configuring, with a processor, the first section with the first section configuration port when the second section is defective; and
    configuring, with the processor, the second section with the second section configuration port when the first section is defective,
    wherein the increments are dependent on hardware implementation requirements.

6. The method according to claim 5, further comprising forming a programmable fusible link connecting the first section configuration port and second section configuration port to a first source of configuration data and second source of configuration data, respectively.

7. The method according to claim 6, wherein I/O connections are formed into subsets that are externally connected to only include functional I/O sections.

8. The method according to claim 7, wherein configuration software enables steering logic to establish routing paths to functional sections of the PLD.

9. The method according to claim 8, further comprising: configuring I/O connections to said section having an acceptable level of defects.

10. The method according to claim 9, further comprising: forming programmable steering logic on the PLD for steering configuration bits to functional regions of the PLD.

* * * * *